United States Patent [19]

Kennell et al.

[11] Patent Number: 4,475,458
[45] Date of Patent: Oct. 9, 1984

[54] VACUUM FRAME FOR OFFSET PRINTING PLATES

[76] Inventors: Joseph F. Kennell, 15 Lakeview Dr.; Gerald W. Clemens, 116 Notre Dame Ave., both of East Peoria, Ill. 61611

[21] Appl. No.: 500,322

[22] Filed: Jun. 2, 1983

[51] Int. Cl.³ .............................................. B41F 27/00
[52] U.S. Cl. ...................... 101/382 MV; 101/407 BP; 269/21
[58] Field of Search ..... 101/382 MV, 407 R, 407 BP, 101/407 A, 378; 269/21

[56] References Cited

U.S. PATENT DOCUMENTS

| | | | |
|---|---|---|---|
| 1,914,127 | 6/1933 | Huebner | 101/382 MV |
| 2,597,178 | 5/1952 | Pleydell et al. | 101/382 MV |
| 2,914,289 | 11/1959 | Schutt | 269/21 X |
| 3,294,392 | 12/1966 | Dunham | 269/21 |
| 3,453,957 | 7/1969 | Hamilton | 101/382 MV |
| 3,958,508 | 5/1976 | Sakurai | 101/407 BP |
| 4,005,653 | 2/1977 | Arkell | 101/382 MV |
| 4,049,484 | 9/1977 | Priest et al. | 269/21 X |

Primary Examiner—Edgar S. Burr
Assistant Examiner—John A. Weresh
Attorney, Agent, or Firm—Wood, Dalton, Phillips, Mason & Rowe

[57] ABSTRACT

A vacuum frame for holding at least one negative and a plate for exposure to intense light to transfer the negative image to the plate to fashion a printing plate. The frame has a base with a flat upper surface to support the plate and negative. A plurality of apertures are disposed about the periphery of the upper surface, the apertures communicating with a vacuum source. Overlying the upper surface and the apertures is a mesh material which defines a multiplicity of small air passages over the upper surface. The plate and negatives are supported on the mesh material and upper surface and are aligned by suitable aligning means. A flexible transparent cover is positioned over the upper surface to cover the negative, plate and mesh material. The evacuation of air through the apertures and air passages causes the cover, negative and plate to be held closely together and to the base for exposure of the plate.

6 Claims, 8 Drawing Figures

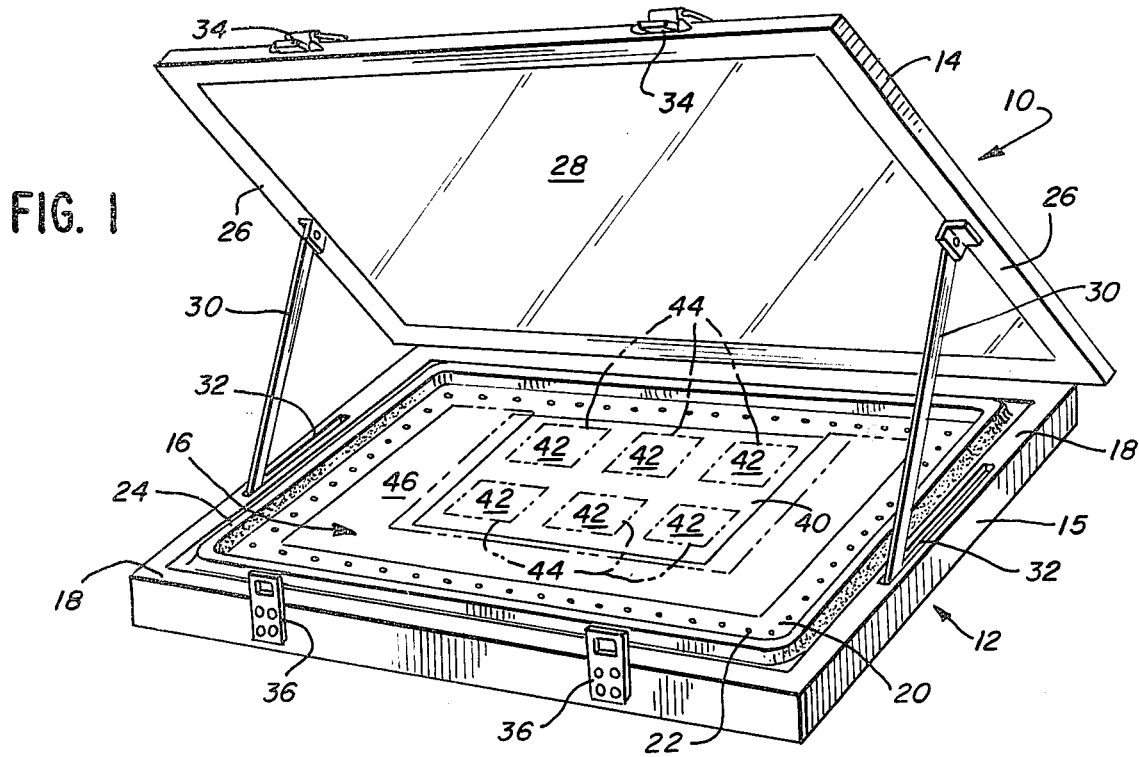
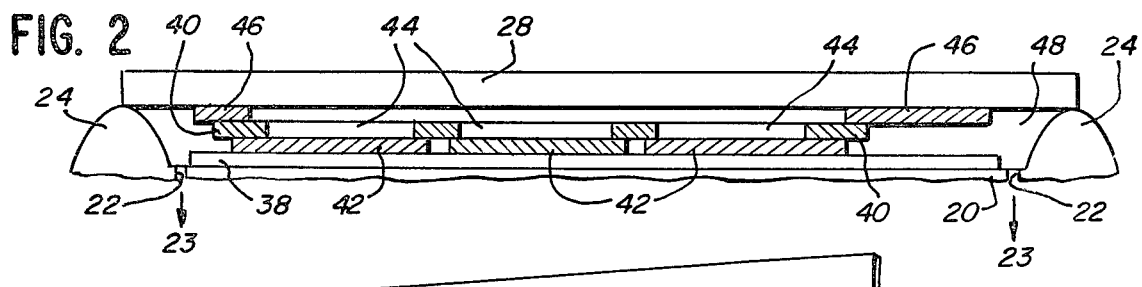
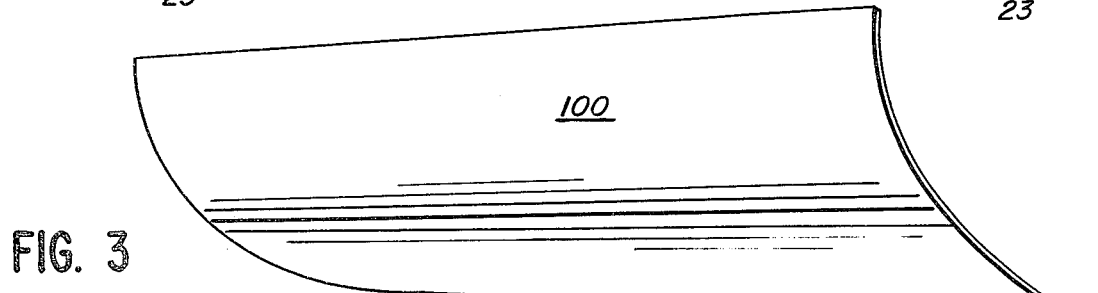

VACUUM FRAME FOR OFFSET PRINTING PLATES

DESCRIPTION

BACKGROUND OF THE INVENTION

1. Field of the Invention

This invention relates to offset printing and more particularly to devices which hold an unexposed printing plate and negatives for exposure of the printing plate.

2. Description of the Prior Art

In offset printing, as with other printing methods, a great portion of the time and expense is spent on the fashioning of the printing plates. As is well-known, printing plates are constructed to selectively transfer ink to the material, such as paper which is being printed.

A common method by which printing plates are fashioned is to photograph the text of the subject matter to be printed to produce a negative. For example, should the text be printed material consisting of dark lettering on a white background, the negative produced will be opaque with transparent portions thereof corresponding to the lettering of the text. The negative is placed over a plate and then exposed to intense light. Due to the chemical makeup of the plate, the printing image on the plate is rendered grease receptive and water repellant, while the non-print areas are rendered water receptive and ink repellant, thereby enabling the plate to be used in a printing process to reproduce the text.

During exposure of the printing plate and negative to the intense light, it is important that the negative and printing plate be held tightly together. Any spaces between the negative and printing plate causes the light passing through the transparent portions of the negative to diffuse which results in a printing plate which does not closely comport to the transparent portions of the negative and which results in fuzzy or ill-defined printing.

One known frame for supporting the plate and negatives during the exposure thereof provides a base having a hinged, glass cover. Extending across the base is an elastic surface, for example a rubber material, which is surrounded by a raised seal. When the glass cover is closed down on the base, the space between the glass and the elastic surface is sealed from the environment by the seal.

To fashion a plate, the plate is positioned and centered upon the elastic surface. The negatives, attached to a carrier sheet, are then positioned on top of the plate. The carrier sheet is opaque such as, for example, goldenrod paper, having the negatives secured thereto as by adhesive tape. Portions or "windows" are removed from the carrier sheet in the regions of the negatives so as not to interfere with the passage of light through the negatives to the plate.

After the carrier sheet and negatives have been positioned on the plate, masking material is superposed on the plate to, in combination with the carrier sheet, cover all portions of the plate not aligned beneath the negatives for exposure. The purposeof the masking material is to prevent unintended portions of the plate from being exposed.

After the plate, carrier sheet and mask have been positioned on the elastic surface, the glass cover is closed on top of the stack defined by the plate, carrier sheet, negatives and mask. A vacuum is induced into the vacuum space to evacuate air between the elastic surface and the glass. Evacuation of the air causes the elastic to press against the glass and hold the plate and carrier sheet and negatives and mask together for exposure of the plate.

A drawback of the frame set forth above is that it is relatively expensive to manufacture. The frame requires an elastic surface and means necessary to affix the surface to the base. Furthermore, the frame requires a seal around the elastic surface to permit the vacuum to hold the various layers tightly against the glass. Additionally, the frame requires a relatively strong sheet of glass and a framework necessary to support the glass since vacuums are typically in the range of from 27-28 inches of mercury below atmospheric pressure.

Another drawback of the frame described above is that the preparatory steps for exposing the plate are time-consuming. The carrier and mask must be fashioned for each set of negatives. In particular the attachment of the negatives to the mask and removal of the portions of the mask underlying the negatives consumes a great portion of time.

Another drawback concerns the production of plates for color printing. For color printing, negatives are produced for each color, the negatives, in turn, being used to fashion plates for that particular color. During printing, it is necessary that the plates of each individual color applying that particular color ink cooperate and coordinate with the other plates to produce the desired color printing. This coordination requires that the negatives be precisely positioned upon the plates so that when the completed plates are affixed to the printer rollers, the plates will coordinate to produce the desired result. Heretofore, the aligning and positioning of negatives on the carrier sheet and the carrier sheet on the plate was done by hand.

The present invention is directed toward overcoming one or more of the drawbacks noted above.

SUMMARY OF THE INVENTION

Accordingly, the present invention sets forth a frame which is of inexpensive manufacture and which can quickly and easily position the negatives for exposure of the plate.

Toward this end, a vacuum frame for offset printing plates is set forth having a base with a planar upper surface. The upper surface has a plurality of apertures which communicate with a vacuum source. Overlying the upper surface is a mesh material such as a metallic screen. The screen is adapted to support the printing plate and extend past the border of the printing plate.

Extending through the upper surface of the table and screen are a pair of pins which are pneumatically operated to extend upward from or retract into the table top. These pins, through cooperative holes in the plate to be exposed, provide means to universally align all plates produced on the frame.

The frame also includes a pair of frame strips which extend across the frame and which are pneumatically movable from a lowered position in which they lay over the screen to a raised position wherein they are spaced above the screen. The frame strips serve to clamp the plate closely to the top and the screen. Pegs upstanding from the frame strip, through cooperative holes in the negatives, provide for universal alignment of the negatives over the printing plate.

Also provided is a pliable, transparent cover sheet adapted to overlay the screen. The transparent cover provides a means to seal the vacuum, and tightly press the negatives against the plate.

In operation, the plate and negatives are punched with the appropriate holes for alignment on the table top and along the frame strips. The transparent sheet is lifted and the frame strips are raised while the pins are lowered. The plate is inserted under the frame strips over the screen and the pins are raised to register with the holes which have been punched in the plate. Thereafter, the frame strips are lowered to clamp the plate tightly against the screen. The negatives are positioned by registry of the pegs along the frame strips with the holes formed in the negatives. Once the negatives have been positioned, the transparent sheet is lowered over the negatives and plate and a vacuum is induced in the apertures in the top. The passages defined by the gridwork of the screen overlying the top enables the air to be evacuated from under the transparent sheet and plate and from between the negatives and the plate. This, in turn, causes the transparent sheet, negatives and plate to be held tightly together and against the screen and upper surface for subsequent exposure of the plate. Once exposure has been completed, the vacuum is relieved and the transparent sheet is lifted for removal of the negatives and the plate.

Accordingly, it is an object of the present invention to set forth a vacuum frame for offset printing plates which is relatively inexpensive to manufacture. The upper surface is planar, non-flexible and need only be provided with apertures disposed about the periphery. Cooperating with and overlying the upper surface and apertures, the mesh screen defines a multiplicity of air passages over the upper surface for air to flow from all regions of the upper surface and from between the plate, negative and cover to the apertures when evacuated from the upper surface. Furthermore, by providing a sturdy upper surface to support the plate and negative and a means to evacuate air over the surface, the transparent cover is made light and flexible to hold the negatives and plate against the upper surface covered by the mesh material and seal the vacuum over the upper surface from the environment. Accordingly, the frame of the present invention may be simply and inexpensively constructed. The frame does not require elaborate seals, an elastic surface, a heavy sheet of glass or elaborate framework necessary to support the glass.

Further objects and advantages will become evident upon a reading of the specification, drawings and claims.

BRIEF DESCRIPTION OF THE DRAWINGS

FIG. 1 is a perspective top view of a prior art vacuum frame in the open position;

FIG. 2 is a schematic sectional view showing the arrangement of the plate, negatives and mask the vacuum frame illustrated in FIG. 1;

FIG. 3 is a perspective top view of the vacuum frame of the present invention;

DESCRIPTION OF THE PREFERRED EMBODIMENT

Figure 4:
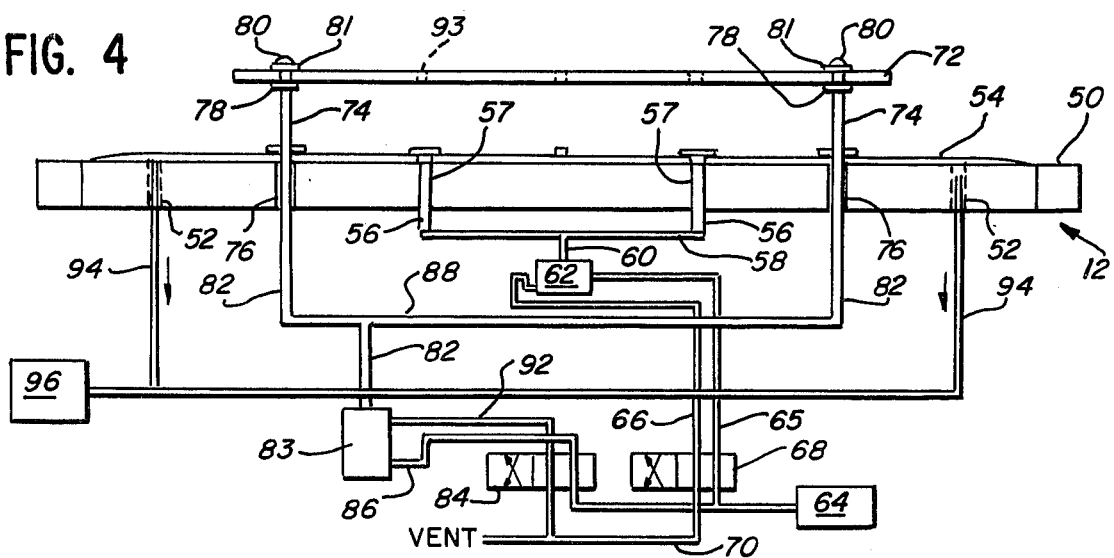
FIG. 4 is a schematic sectional view of the frame of FIG. 3 illustrating the operation of certain elements therein.

Viewing FIGS. 1 and 2 a prior art vacuum frame 10 is shown. The frame 10 includes a base 12 and a cover 14 hinged to the base 12 for opening and closing thereof.

The base 12, typically supported above the floor by legs or the like (not shown) is generally planar having a sunken central portion 16 defining a raised border 18 extending about the periphery of the base 12. Connected to the border 18 is an elastic member 20 which extends across and covers the sunken central portion 16. The elastic member 20 is typically fashioned from rubber or the like. A plurality of holes 22 extend through and are disposed about the perimeter of the elastic member 20 spaced inward of the border 18. These holes 22 communicate with a vacuum source (indicated by arrows 23 in FIG. 2). Any number of such holes 22 have been provided, including as few as two, while still providing the necessary vacuum.

Extending about the outer perimeter of the elastic member 20 so as to lie adjacent to the border 18 is a pliable seal 24 adapted to seal against the cover 14 in a manner described below. As shown in FIGS. 1 and 2, the seal 24 may be semicircular and extends upward from the elastic member 20 past the border 18.

The cover 14 is hinged to the border 18 of the base 12 to as to pivot toward and away from the base 12. The cover 14 has a metal edging 26 which mounts and supports a glass 28. To support and guide the pivotal opening and closing of the cover 14 toward and away from the base 12, a pair of struts 30 interconnect the cover edging 26 to the border 18. Channels 32, each associated with a strut 30, receive the struts 30 to permit the cover 14 to closely mate with the base 12.

To tightly close the cover 14 on the base 12, the cover 14 is provided with a pair of latches 34 which are adapted to engage a pair of complementary hooks 36 disposed on the base 12 to secure the latch the cover 14 over the base 12.

To hold and expose a metal plate 38 covered with a thin film of photosensitive material to intense light to transfer the image from negatives to the plate 38, the plate 38 is positioned on the elastic member 20 inward of the holes 22 as substantially shown in FIG. 1 and schematically shown in FIG. 2. Thereafter, a carrier sheet 40 having any number of negatives 42 secured thereto is positioned over the plate 38. The carrier sheet 40 is typically goldenrod paper of the like having the negatives 42 secured to its underside (i.e., the side adjacent to the plate 38 as by adhesive tape. Windows 44 (FIG. 2) are cut from the carrier sheet 40 so as not to interfere with the passage of light to and through the negatives 42 and to the plate 38.

It should be noted at this point that when color printing is desired, negatives are required for each color to, in turn, fashion a plate dedicated to each color. Accordingly, the positioning of the negatives 42 on the carrier sheet 40 and the positioning of the carrier sheet 40 on the plate 38 must be done in such a manner that the resulting plates will be coordinated with one another to produce the desired result. With the frame 10 shown in FIGS. 1 and 2, the positioning of the negatives 42 and carrier sheet 40 on the plate 38 is done by hand with systems using pins to accomplish the alignment being common. This mandates that the aligning process to produce coordinated plates for different colors must likewise be done by hand. Hand alignment is time consuming and costly from a labor standpoint.

After the carrier sheet 40 has been positioned on the plate 38, a mask 46 is laid over the plate 38 overlapping the carrier sheet 40 to cover the remaining portions of the plate 38 leaving only the regions aligned with the negatives 42 for exposure to light. As shown in FIG. 1, the mask 46 is U-shaped.

Once the plate 38, carrier sheet 40 and negatives 42 and the mask 46 have been positioned on the elastic member 20, the cover 14 is closed and latched resulting in the seal 24 bearing against the glass 28. The mask 46, carrier sheet 40 and negatives 42 and plate 38 are essentially stacked upon the elastic member 20. The glass 28 bears closely against the seal 24 to define a closed vacuum space 48 about the stack of the plate 38, carrier sheet 40 and negatives 42 and mask 46. Once the cover 14 has been closed, a vacuum is induced to evacuate air through the holes 22 from the vacuum space 48. Evacuation of air from the vacuum space 48 causes the elastic member 20 and the cover 14 to be drawn together. The elastic member 20, due to the pressure differential between atmospheric pressure and the vacuum in the vacuum space 48, deforms toward the glass 28 to press the plate 38, carrier sheet 40 and negatives 42 and mask 46 against the glass 28. Accordingly, the glass 28 must be sturdy enough to withstand the aforesaid pressure differential. When the elastic member 20 has deformed sufficiently to hold the elements closely against the glass 28, an intense light from an light source (not shown) is directed through the glass 28 and negatives 42 to transfer the image on the negatives 42 to the plate 38. When the plate is sufficiently exposed, atmospheric air is readmitted into the vacuum space 48 to permit the cover 14 to be unlatched and opened away from the base 15 and the plate 38, carrier sheet 40 and mask 46 to be removed.

Turning to FIGS. 3-8, the vacuum frame for offset printing plates of the present invention is shown in detail. Portions thereof similar to the vacuum frame described above will carry like reference numerals.

To support a plate 38 and negatives 42, the vacuum frame 10 of the present invention has a base 12 with a planar upper surface 50. While the drawings illustrate the upper surface 50 as being generally flat, it is contemplated that the upper surface 50 could be, if desired, curved or of any other configuration. The base 12 is fashioned from metal such as aluminum and has a plurality of apertures 52 spaced inward from and about the periphery of the upper surface 50. The apertures 52 extend into the base 12 to provide means by which air may be evacuated from the upper surface 50 as described in detail below.

To support the plate 38 on the upper surface 50 and provide the means whereby air may be evacuated over the upper surface 50 is a mesh material such as a screen 54. The screen 54, preferably embodied as a mesh material such as a metal screen but which may be any suitable porous sheet material, closely overlays the upper surface 50, including the apertures 52. About its perimeter the screen 54 is attached to the upper surface by, for example, adhesive tape. Of course other methods for attaching the screen 54 are well within the scope of the present invention.

It is to be understood that the upper surface 50 is adapted to provide a strong, planar support for the plate 38 and negatives 42. Cooperating with the upper surface 50, the screen 54 defines a network of small air passages. These air passages provide paths for air to flow from all regions of the upper surface 50 covered by the screen 54 to the apertures 52. Accordingly, it is not necessary to machine grooves, bores or the like over the entire upper surface to provide air passages. The provision of the screen 54 over the upper surface 50 simply and inexpensively defines the desired air passages.

Providing a means induce a vacuum over the upper surface 50, the apertures 52 as shown in FIG. 4 communicate via conduits 94 with a vacuum means schematically shown as vacuum pump 96. While the drawing illustrates the apertures 52 as communicating with the vacuum pump 96 through a series of conduits, it is to be understood that headers either within the base 12 or disposed externally thereof are well within the scope of the present invention. As can be appreciated, due to the aforementioned passages over the upper surface 50 created by the screen 54, air is able to pass to the apertures 52 from all areas of the upper surface 50.

To align and hold the plate 38 positioned on the screen 54, the frame 10 has a pair of plate pins 56 which are disposed in bores 57 in the base 12. The plate pins 56 are provided with means whereby they may be raised to protrude upward from the upper surface 50 and screen 54 to register with holes in the plate 38 and retract into the base 12.

The means by which the plate pins 56 are moved to extend from or retract into the base 12 are shown in FIG. 4. Each of the pins 56 is secured to a yoke 58 or other suitable linkage which, in turn, is connected to a piston (not shown) by a rod 60. The piston is housed within an air cylinder 62 which communicates with an air compressor 64 via conduits 65 and 66. Interposed in the conduits 65,66 between the air cylinder 62 and the compressor 64 is a first valve 68. The first valve 68, manipulated by, for example, a foot pedal or a hand operated joystick, is movable beween a first position to retract the pins 56 and a second position to raise the pins 56. In the first position, as illustrated in FIG. 4, the first valve 68 is positioned to port compressed air from the compressor 64 to conduit 65 which, in turn, admits the compressed air into the cylinder 62 to displace the piston and lower the plate pins 56. Conduit 66 at the same time is placed in communication with a vent 70 to relieve air from the air cylinder 62 during movement of the piston.

When the first valve 68 is moved to the second position, conduit 66 is placed in communication with the compressor 64 to route compressed air to the opposite side of the piston within the air cylinder 62 to displace the piston and raise the pins 56. At the same time, conduit 65 is placed in communication with the vent 70 to relieve air from the air cylinder 62 to permit movement of the piston and the raising of the pins 56.

To further secure the plate 38 to the upper surface 50 and more particularly the screen 54, the frame 10 also includes movable frame strips 72. As seen in FIGS. 3-6, the frame strips 72 are shown as having an elongated, rectangular shape.

Viewing FIG. 4, the frame strips 72, in a manner similar to that of the pins 56, are movable between a raised position wherein the frame strips 72 are spaced above the upper surface 50 and screen 54, and a lowered position wherein the frame strips 72 bear against the upper surface 50 screen 54.

To provide for the aforesaid raising and lowering of the frame strips 72, each frame strip 72 is connected at its ends to posts 74 which pass through complementary bores 76 in the base 12. Each post 74 has, to mount the frame strips 72, a fixed retainer 78 to support the underside of the frame strip 72. A screw 80 threaded axially into the post 74 and a washer 81 secure the frame strip 72 to the post 74 and retainer 78. Each post 74, opposite the frame strip 72, is connected to a suitable linkage 82 which raises and lowers the posts 74 and the frame strips 72 as, for example, by connection to a piston (not shown) housed within an air cylinder 83. While FIG. 4 shows a linkage 82 interconnecting the posts 74 of one frame strip 72 and being manipulated by a dedicated cylinder 83, it is to be understood that any number of linkages would be suitable, such as one which would manipulate both frame strips 72 from a single cylinder.

Referring again to the particular linkage 82 illustrated, the compressor 64 is placed in communication with the air cylinder 83 through a second valve 84 to raise the frame strips 72. The second valve 84, either operated by a foot pedal or by a hand operated joystick, is movable to a first, raised position wherein compressed air from the compressor 64 is routed to a conduit 86 which in turn feeds the air cylinder 83. At the same time, the second valve 84 places a conduit 92 in communication with the vent 70. Accordingly, when the second valve 84 is placed in the first position compressed air from the compressor 64 flows through conduit 86 the cylinder 83 to displace the piston housed therein and raise the posts 76 and frame strip 72 attached thereto. At the same time, air vented from the cylinder 83 as a result of the movement of the piston therein, is vented through conduit 92, the second valve 84 and to the vent 70.

When the second valve 84 is moved to the second position to lower the frame strip 72, conduit 92 is placed in communication with the compressor 64 to supply compressed air to the cylinder 83 to move the piston housed therein and lower the frame strip 72. At the same time, conduit 86 is placed in communication with the vent 70 to relieve air from the hydraulic cylinder 83 as the frame strip 72 is lowered.

Viewing FIGS. 3-8, the operation of the frame 10 of the present invention will now be described. To position the plate 38 upon the upper surface 50 and more particularly the screen 54, the plate 38 is punched with a pair of holes adapted to register with the plate pins 56. It is to be understood that universal placement of the holes in the plates 38 assures that all plates fashioned on the frame 10 will reside in the identical position. As set forth above, this is particularly advantageous where color printing is involved.

Subsequent to the punching of the holes in the plate 38, the frame strips 72 are raised and the plate pins 56 are lowered by moving the first and second valves 68, 84 to the proper positions. Raising the frame strips 72 and lowering the pins 56 provides a clear, unobstructed passageway through which the plate 38 can be inserted across the screen 54 and positioned upon the upper surface 50. When the plate 38 is positioned such that the holes register with the plate pins 56, the plate pins 56 are raised to protrude upward through the holes in the plate 38 to properly position the plate 38 on the frame 10. Thereafter, the frame strips 72 are lowered to clamp the plate 38 against the screen 54. As shown in FIGS. 3 and 4, when the frame strips 72 are lowered, the plate pins 56 pass through complementary openings 93 in the lower frame strip 72.

Figure 5:
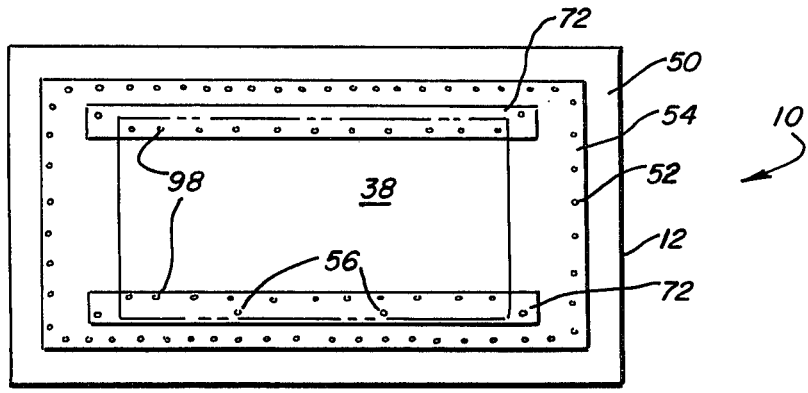
FIG. 5 is a top plan view of the vacuum frame illustrating the positioning of the printing plate.
Figure 6:
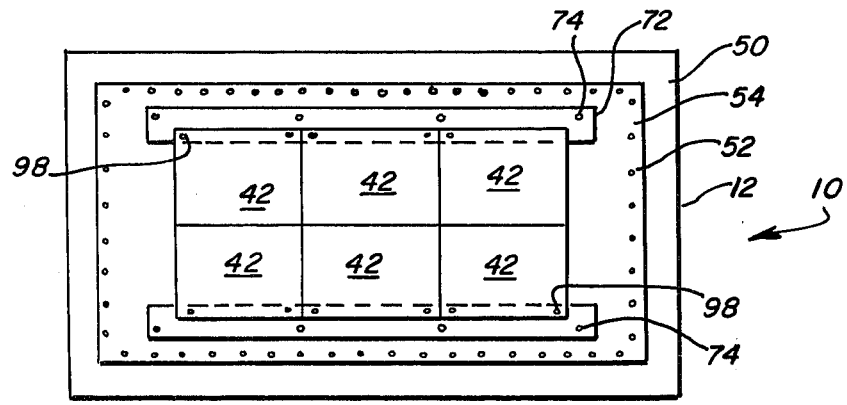
FIG. 6 is a top plan view of the vacuum frame of FIG. 5 showing the arrangement of the negatives thereon.
Figure 7:
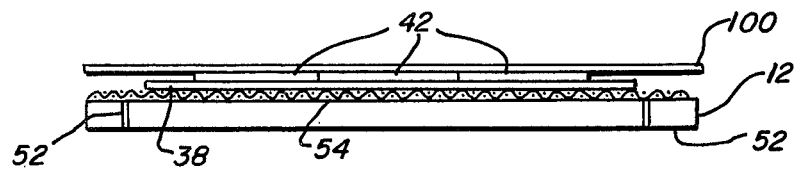
FIG. 7 is a section view of the frame of FIG. 6 before imposition of a vacuum.

Subsequent to aligning and clamping of the plate 38 upon the screen 54, negatives 42 are distributed on the frame 10 to overlay the plate 38 as shown in FIG. 6. As seen in FIGS. 3, 5 and 6, each frame strip 72 has the plurality of upstanding pegs 98 extending longitudinally therealong. To align the negatives 42 over the plate 38, each negative is punched with holes adapted to register with the pegs 98 to align the negative 42 over the plate 38 and retain the negative 42 in place. It is to be understood that universal positioning of the pegs 98 and the holes in the negatives 42 will result in universal alignment of the negatives over the plate 38 as shown in FIG. 6. Again, this is advantageous since color printing often requires that the negatives of each color for a particular pattern cooperate with the negatives of other colors. Universal alignment of the negatives provides a means to assure cooperation of the negatives of different colors without resorting to painstaking and time consuming hand alignment of the negatives.

After the negatives 42 have been positioned along the frame strip 72 over the plate 38, a flexible, transparent cover 100, connected along one side to the base 12, is lowered to cover the upper surface 50 in such a manner as to extend outwardly from and cover the apertures 52. The transparent cover 100 may be a plastic Mylar or the like. Since the cover 100 is flexible and light, the frame 10 does not require elaborate supports to hold the cover 100 nor does the frame require the linkages and latches heretofore necessary to close and seal the frame.

Figure 8:
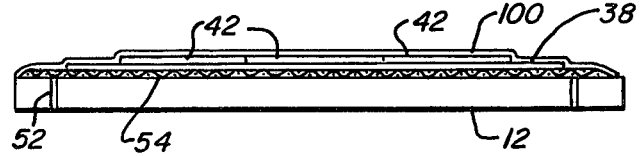
FIG. 8 is a section view of the frame of FIG. 7 after the vacuum has been induced.

After the cover 100 has been positioned over the upper surface 50 and the plate 38 and negatives 42 stacked thereon, the vacuum pump 96 is started which, in turn, through the apertures 52, evacuates air from underneath the cover 100. Due to the air passages created by the mesh material of the screen 54 over the upper surface 50, and the matted surfaces of the plate 38 and negatives 42, air is evacuated from underneath the plate 38, from between the plate 38 and negatives 42, and between the cover 100 and the screen 54. Typically, vacuums in the range of between 27 and 28 inches of mercury below atmospheric pressure (i.e. absolute pressure between 1 and 2 inches of mercury) are satisfactory. It is also to be noted that due to the flexibility of the cover 100, seals found in prior devices are not required to seal the environment from the upper surface 50. The cover 100 closely mates with the screen 54 about the border of the upper surface 50 to be, in effect, self-sealing. After the air has been evacuated, the stack of the plate 38, negatives 42 and cover 100 are held tightly against the base 12 and covering screen 54 as schematically shown in FIG. 8. In this position, the negatives 42 are held against the plate 38 in readiness for exposure of the plate.

After exposure of the plate 52, the vacuum is relieved from the apertures, freeing the cover 100 for lifting away from the negatives 42 and the plate 38. The negatives 42 are removed away from the pegs 98, the frame strips 72 are raised, and the plate pins 56 are lowered to permit removal of the plate 38 from the frame 10. After removal of the exposed plate 38, the frame 10 is in readiness to receive a new, unexposed plate.

While we have shown and described a certain embodiment of a vacuum frame for offset printing plates, it is to be understood that modifications can be made without departing from the spirit and scope of the invention set forth in the specification, drawings and claims.

We claim:

1. A frame for holding at least one negative and a plate for exposure of said plate to intense light to fashion a printing plate comprising:

a base having a flat upper surface made of non-porous material, said surface having a plurality of apertures only disposed about the perimeter thereof;

a screen overlying said upper surface and apertures to define a multiplicity of air passages over said base upper surface, said screen being adapted to support said plate and at least one negative superposed thereon and defining a network of small air passages which provide paths for air to flow from all regions of said upper surface covered by the screen to said peripheral apertures;

a flexible, transparent cover adapted to overlie said screen, plate, negative and engaging said base surface about said screen; and means to evacuate air through said air passages and said apertures whereby said cover, negative and plate are closely held against said screen and upper surface for exposure of said plate.

2. The device of claim 1 wherein said screen is metallic.

3. The device of claim 1 wherein said screen is fiberglass.

4. The frame of claim 1 wherein said screen is adhered about its periphery to said upper surface.

5. The device of claim 1, further comprising a plurality of replaceable frame strips adapted to overlie the plate and having pegs on their upper side adapted for reception within alignment holes in a plurality of negatives.

6. The device of claim 5, wherein the frame strips are vertically reciprocable to clamp the plate against the screen, and the frame strip pegs are located so as to place the negatives in a specific arrangement.

* * * * *